United States Patent
Matsuda

(10) Patent No.: US 8,969,954 B2
(45) Date of Patent: Mar. 3, 2015

(54) SEMICONDUCTOR DEVICE HAVING PLURALITY OF PERIPHERAL TRENCHES IN PERIPHERAL REGION AROUND CELL REGION

(75) Inventor: Shigenobu Matsuda, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 149 days.

(21) Appl. No.: 13/388,565

(22) PCT Filed: Aug. 25, 2010

(86) PCT No.: PCT/JP2010/064349
§ 371 (c)(1),
(2), (4) Date: Feb. 2, 2012

(87) PCT Pub. No.: WO2011/024842
PCT Pub. Date: Mar. 3, 2011

(65) Prior Publication Data
US 2012/0126284 A1 May 24, 2012

(30) Foreign Application Priority Data
Aug. 28, 2009 (JP) .................. 2009-198615

(51) Int. Cl.
*H01L 29/66* (2006.01)
*H01L 23/58* (2006.01)
*H01L 29/06* (2006.01)
*H01L 29/739* (2006.01)
*H01L 29/40* (2006.01)

(52) U.S. Cl.
CPC ........ *H01L 29/0619* (2013.01); *H01L 29/0638* (2013.01); *H01L 29/7397* (2013.01); *H01L 29/407* (2013.01)
USPC .......................................... 257/331; 257/652

(58) Field of Classification Search
USPC .................................................. 257/331, 652
See application file for complete search history.

(56) References Cited

U.S. PATENT DOCUMENTS

| RE41,866 E | * | 10/2010 | Yano et al. ..................... 257/139 |
| 2002/0100935 A1 | * | 8/2002 | Inoue ............................. 257/341 |
| 2004/0238884 A1 | * | 12/2004 | Tanaka et al. ................. 257/341 |
| 2006/0278925 A1 | | 12/2006 | Yamaguchi |
| 2007/0007592 A1 | | 1/2007 | Barthelmess et al. |

(Continued)

FOREIGN PATENT DOCUMENTS

| JP | 11 087698 | 3/1999 |
| JP | 2006 332127 | 12/2006 |

(Continued)

OTHER PUBLICATIONS

English machine-translation of JP 2007-123570.*

(Continued)

*Primary Examiner* — Kevin Parendo
(74) *Attorney, Agent, or Firm* — Oblon, McClelland, Maier & Neustadt, L.L.P.

(57) ABSTRACT

A semiconductor device including a cell region and a peripheral region around the cell region, the cell region including: a first semiconductor layer having a first conductivity type; a second semiconductor layer which is formed in an island shape on the surface of the first semiconductor layer and has a second conductivity type different from the first conductivity type; a third semiconductor layer which is formed in an island shape on the surface of the second semiconductor layer and has the first conductivity type; and a plurality of gate trenches penetrating the second semiconductor layer and reaching the inside of the first semiconductor layer, and a termination layer which is formed in an island shape in the surface of the first semiconductor layer and has the first conductivity type.

7 Claims, 5 Drawing Sheets

(56) References Cited

U.S. PATENT DOCUMENTS

| | | |
|---|---|---|
| 2007/0052014 A1 | 3/2007 | Takahashi |
| 2007/0194375 A1* | 8/2007 | Kawaguchi et al. ........... 257/330 |
| 2008/0153216 A1* | 6/2008 | Kumar et al. ................. 438/173 |
| 2009/0173995 A1 | 7/2009 | Takahashi |
| 2010/0187603 A1 | 7/2010 | Hanaoka |

FOREIGN PATENT DOCUMENTS

| | | |
|---|---|---|
| JP | 2007 036221 | 2/2007 |
| JP | 2007 059766 | 3/2007 |
| JP | 2007 123570 | 5/2007 |
| JP | 2008 277352 | 11/2008 |
| WO | 2009 013967 | 1/2009 |

OTHER PUBLICATIONS

English machine-translation of JP 2007-059766.*

International Search Report issued on Nov. 22, 2010 in PCT/JP10/64349 filed on Aug. 25, 2010.

* cited by examiner

SEMICONDUCTOR DEVICE HAVING PLURALITY OF PERIPHERAL TRENCHES IN PERIPHERAL REGION AROUND CELL REGION

TECHNICAL FIELD

The present invention relates to a semiconductor device and more specifically, to an insulated gate semiconductor device including trenches.

BACKGROUND ART

In one of conventionally known techniques, a plurality of diffusion layers are formed in a peripheral region in order to provide a high-voltage semiconductor element.

FIG. 9 is a view showing a cross-sectional structure of a conventional semiconductor device described in PTL 1. The conventional semiconductor device described in PTL 1 is a trench-type IGBT (insulated gate bipolar transistor) 500 which includes a cell region and a peripheral region formed in a semiconductor basic substance.

Each of IGBT cells forming the cell region includes an n− type drift layer 51, a p type base layer 52, an n+ type emitter layer 53, a p+ type collector layer 54, an n+ type buffer layer 55, a gate electrode 71 formed in a gate trench 61 with a gate insulating film 62 therebetween, an emitter electrode 72, and a collector electrode 73.

The peripheral region includes: the n− type drift layer 51, the p−type base layer 52, an n+ type channel stopper layer 57, a plurality of p+ type float layers 58, an insulating film 66, and an EQR electrode 75.

In the IGBT 500, if plus voltage is applied to the collector electrode 73 and is gradually increased while the gate is off, a depletion layer 80 extends from the interface between the drift layer 51 and base layer 52, which constitute the cell region, toward the surface of the semiconductor basic substance and toward the peripheral region. The depletion layer 80 extends within the drift layer 51 as indicated by a dashed line and further extends beyond the plurality of float layers 58 close to the channel stopper layer 57. In such a manner, the plural float layers 58 can reduce the curvature of the end of the depletion layer 80 extending within the drift layer 51, thus reducing the electric field concentration. The conventional semiconductor device can therefore have higher breakdown voltage.

CITATION LIST

Patent Literature

PTL 1: Japanese Patent Laid-open Publication No. 2008-277352

SUMMARY OF INVENTION

Technical Problem

By the way, especially in a wet environment, it is known that if movable ions, minus ions, or moisture penetrates into the surface of the oxide film in the surface of the peripheral structure, plus charges are induced to the surface of the semiconductor basic substance under the oxide film to cause an uneven potential distribution and therefore lead to reduction of breakdown voltage. Moreover, in the conventional semiconductor device, the end of the depletion layer 80 extending in the surface side of the semiconductor basic substance is exposed to almost the entire surfaces of the drift layer 51, the base layer 52, and the float layer 58. In other words, the conventional semiconductor device has a structure which is subject to changes in breakdown voltage due to the aforementioned influence of movable ions and the like and cannot have sufficient reliability.

In order to reduce the influence of the movable ions or the like, the conventional semiconductor device has taken countermeasures such as a conducting film formed on the insulating film 66. However, this will complicates the manufacturing processes of the semiconductor device and increase the cost.

The present invention was invented in order to solve the aforementioned problems, and an object of the present invention is to provide a semiconductor device capable of providing high reliability with the breakdown voltage increased. Moreover, another object of the present invention is to provide a semiconductor device which can be manufactured at low cost.

Solution to Problem

In order to solve the aforementioned problems, an aspect according to an embodiment of the present invention is a semiconductor device including a cell region and a peripheral region around the cell region, the cell region including: a first semiconductor layer having a first conductivity type; a second semiconductor layer which is formed in an island shape in the surface of the first semiconductor layer and has a second conductivity type different from the first conductivity type; a third semiconductor layer which is formed in an island shape in the surface of the second semiconductor layer and has the first conductivity type; and a plurality of gate trenches penetrating the second and third semiconductor layer and reaching the inside of the first semiconductor layer, the peripheral region including: a plurality of peripheral trenches penetrating the second and third semiconductor layers and reaching the inside of the first semiconductor layer; and a termination layer which is formed in an island shape in the surface of the first semiconductor layer and has the first conductivity type. The semiconductor device further includes a semiconductor basic substance composed of the first, second, and third semiconductor layers and the termination layer, and in a surface of the semiconductor basic substance, the first semiconductor layer is not exposed on the surface side of the first semiconductor layer.

Effects of Invention

According to the present invention, it is possible to provide a semiconductor device capable of providing high reliability with the breakdown voltage increased. Furthermore, according to the present invention, it is possible to provide a semiconductor device which can be manufactured at low cost.

DESCRIPTION EMBODIMENTS

Figure 1:
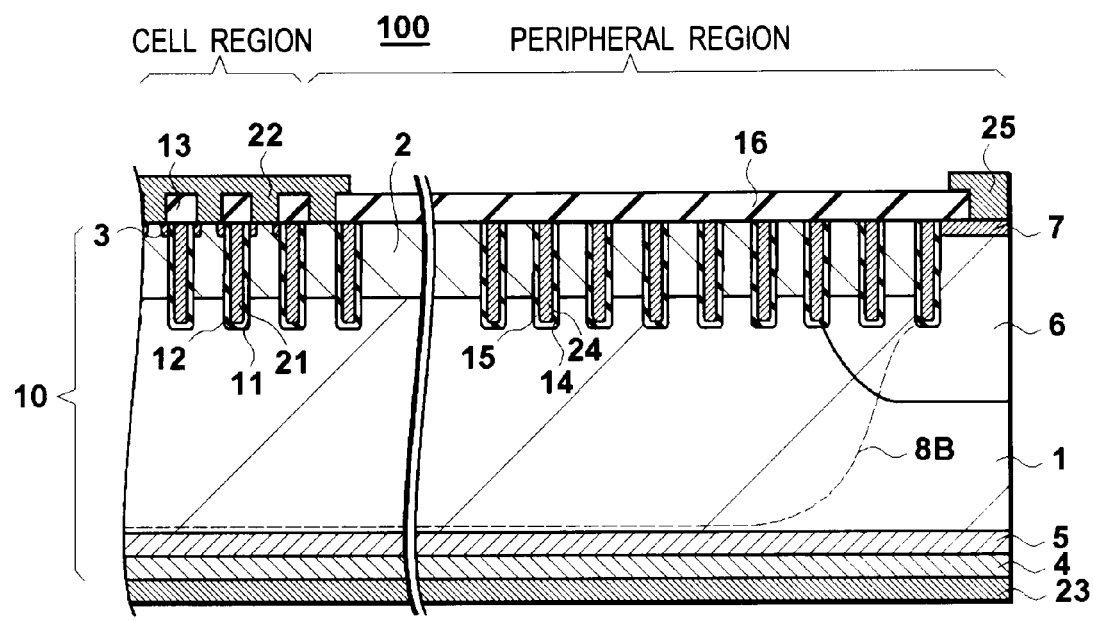
FIG. 1 is a view showing a cross-sectional structure of a semiconductor device according to a first embodiment of the present invention.

Embodiments of the present invention describe examples of semiconductor devices to which the present invention is applied, especially, each including an IGBT (insulated gate bipolar transistor) of a trench-type structure. In the following description of the drawings, same or similar portions are given same or similar reference numerals. The drawings are schematic and are different from real ones. Some portions have different dimensional relations and proportions through the drawings.

The embodiments described below are examples of devices and methods to embody the technical idea of the present invention. The technical idea of the present invention does not specify arrangements of the constituent components and the like to the followings. Various changes can be made for the technical idea of the present invention within the scope of claims.

First Embodiment

Figure 2:
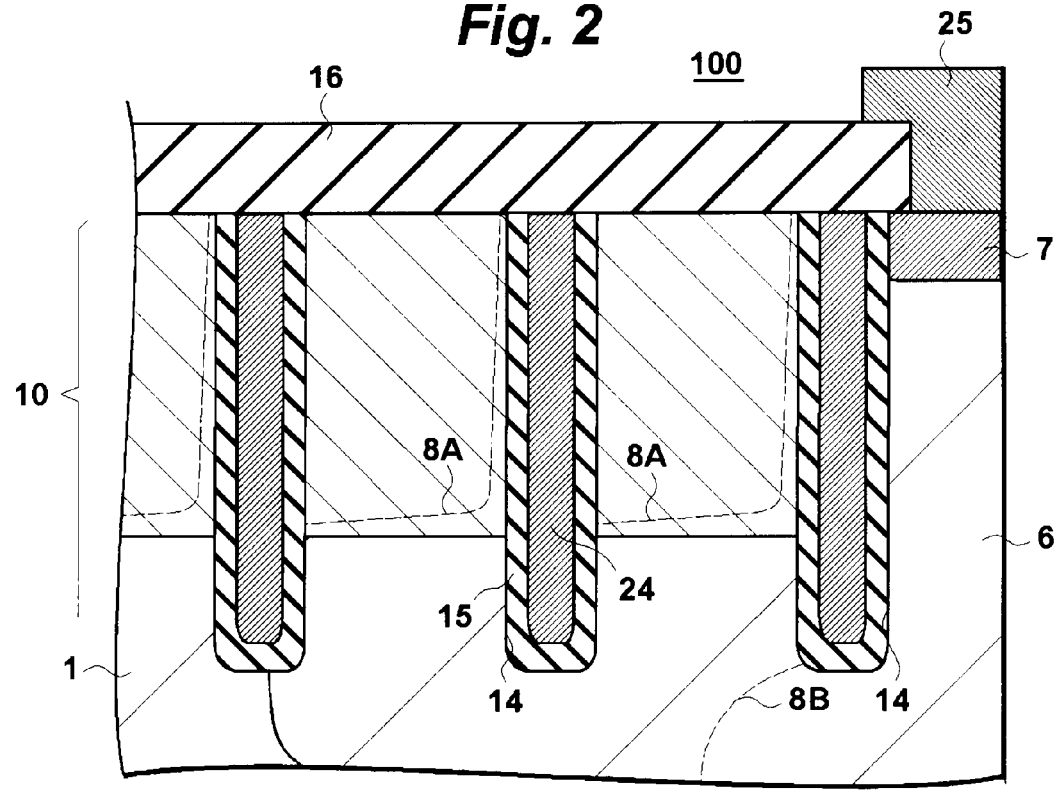
FIG. 2 is a view showing a cross-sectional structure of a main part of a peripheral region of the semiconductor device according to the first embodiment.

FIG. 1 is a view showing a cross-sectional structure of a semiconductor device according the first embodiment of the present invention. FIG. 2 is a view showing a cross-sectional structure of a main portion in a peripheral region of the semiconductor device according to the first embodiment of the present invention.

The semiconductor device according to the first embodiment includes an IGBT 100 and includes a cell region and a peripheral region formed in a semiconductor basic substance 10. The cell region includes plural IGBT cells and is a driving region which is configured to conduct and shut off current flowing in the IGBT 100. The peripheral region includes plural peripheral trenches 14 and is a non-driving region which reduces the electric field concentration to increase the breakdown voltage of the IGBT 100.

Each of the IGBT cells forming the cell region includes an n− type drift layer 1, a p type base layer 2, an n+ type emitter layer 3, a p+ type collector layer 4, an n+ type buffer layer 5, and a gate electrode 21 formed in a gate trenches 11 with a gate insulating film 12 interposed therebetween. The base layer 2 and emitter layer 3 of the IGBT cell are electrically connected to an emitter electrode 22 formed on an inter-layer insulating film 13. The collector layer 4 is electrically connected to a collector electrode 23. The part of the semiconductor basic substance 10 in the cell region is composed of the drift layer 1, base layer 2, emitter layer 3, collector layer 4, and buffer layer 5.

The drift layer 1 having a later-described structure is not exposed in the surface of the semiconductor basic substance 10 (the upper surface in FIG. 1) in the cell region. The base layer 2, which corresponds to a second semiconductor layer according to the present invention, is formed in an island shape on the surface of the drift layer 1 so as to horizontally extend from the cell region to the peripheral region. The emitter layer 3, which corresponds to a third semiconductor layer according to the present invention, is formed in an island shape in the surface of the base layer 2. The collector layer 4, which corresponds to a fourth semiconductor layer according to the present invention, is uniformly formed to the rear surface side of the drift layer 1 (the lower surface side in FIG. 1). The buffer layer 5 is uniformly formed between the drift layer 1 and collector layer 4 on the rear surface of the drift layer 1. In the IGBT 100, the combination of the drift layer 1 and buffer layer 5 corresponds to a first semiconductor layer according to the present invention. However, the buffer layer 5 is not necessary to be provided. In such a case, the drift layer 1 constitutes the first semiconductor layer according to the present invention.

The gate trench 11 is formed from the front surface toward the rear surface to penetrate the base layer 2 and emitter layer 3 and has such a depth that the bottom surface of the gate trench 11 reaches the inside of the drift layer 1. The gate insulating film 12 is uniformly formed along the inner wall and the bottom surface of the gate trenches 11 to insulate the gate electrode 21 from the semiconductor layers. The interlayer insulating film 13 is formed on the gate trench 11 and the gate insulating film 12 to insulate the gate electrode 21 from the emitter electrode 22. The gate electrode 21 is formed with the gate insulating film 12 interposed between the gate electrode 21 and the gate trench 11 so as to fill the inside of the gate trench 11.

The peripheral region includes the n− type drift layer 1, the p−type base layer 2, an n− type channel stopper layer 6, an n+ type channel stopper layer 7, an insulating film 16, conducting layers 24 formed in the peripheral trenches 14 with insulting films 15 interposed therebetween, and an equipotential ring electrode (hereinafter, just referred to as an EQR electrode) 25. The part of the semiconductor basic substance 10 in the peripheral region is composed of the drift layer 1, base layer 2, channel stopper layer 6, and channel stopper layer 7.

The horizontal extension of the base layer 2 in the peripheral region is blocked by the peripheral trench 14 located outermost. The base layer 2 is terminated at the position of the outermost peripheral trench 14. The channel stopper layer 6, which corresponds to a termination layer according to the present invention, is formed in an island shape in the surface of an outermost region of the drift layer 1. The channel stopper layer 6 is formed by diffusing n type impurities into the outermost peripheral region of the drift layer 1. In a plan view, the channel stopper layer 6 overlaps the base layer 2 and some of the peripheral trenches 14. Because of the above-described structure, the drift layer 1 is not exposed in the surface of the semiconductor basic substance 10 also in the peripheral region. Accordingly, the p-n junction formed by the base layer 2 and channel stopper layer 6 is formed only within the semiconductor basic substance 10 and is not exposed in the surface of the semiconductor basic substance 10. The channel stopper layer 6 shown in FIG. 1 is formed deeper than the peripheral trenches 14 but may be shallower than the peripheral trenches 14. The channel stopper layer 7 is formed in an island shape on the surface of the channel stopper layer 6 but may be omitted.

Herein, examples of the impurity concentrations of the semiconductor layers are set as below. The drift layer 1 is formed to have an impurity concentration of $1 \times 10^{13}$ to $1 \times 10^{15}$ cm$^{-3}$; the base layer 2, $1 \times 10^{16}$ to $1 \times 10^{18}$ cm$^{-3}$; and the channel stopper layer 6, $1 \times 10^{13}$ to $5 \times 10^{16}$ cm$^{-3}$. As described later, the impurity concentration of the channel stopper layer 6 is preferably set to 0.2 to 1.0% of the impurity concentration of the base layer 2.

Each peripheral trench 14 is formed from the front surface of the semiconductor basic substance 10 to the rear surface thereof through the base layer 2 to have a depth reaching the inside of the drift layer 1. In a plan view, the peripheral trenches 14 are formed in a ring shape so as to surround the outer circumference of the cell region. The peripheral trenches 14 are formed so as to remove the outer circumferential edge of the base layer 2 (the curved portion at a diffusion layer end) at etching in the manufacturing processes. In other words, horizontal extension of the base layer 2 in the IGBT 100 is blocked by the peripheral trench 14 located outermost, and the base layer 2 is terminated at the position of the outermost peripheral trench 14. Each insulating film 15 is uniformly formed along the inner wall of the peripheral trench 14 to insulate the conducting layer 24 from the semiconductor layers. The insulating film 16 is formed on the peripheral trenches 14 and insulating films 15.

Each conducting layer 24 is formed with the insulating film 15 interposed therebetween so as to fill the inside of the corresponding peripheral trench 14. The EQR electrode 25 is formed to be electrically connected to the channel stopper layer 6, the channel stopper layer 7 and the collector electrode 23. In a plan view, the EQR electrode 25 is formed in a ring shape so as to surround the outer circumference of the cell region.

The operational effects of the IGBT 100 according to the first embodiment are described below. In the IGBT 100, if plus voltage is applied to the collector electrode 23 and is gradually increased while the gate is controlled off, a depletion layer 8B extends from the interface between the drift layer 1 and base layer 2 constituting the cell region and the interface between the drift layer 1 and each gate trench 11 toward the front surface of the semiconductor basic substance 10 and the peripheral region. At this time, the conducting layers 24 in the peripheral trenches 14 are capacitively coupled to each other with the insulating films 15 interposed therebetween, and the peripheral trench 14 more distant from the cell region has a higher potential. Apart of the base layer 2 located between each pair of the peripheral trenches 14 adjacent to each other is substantially equipotential inside. As indicated by a dashed line in FIG. 1, a depletion layer 8B extends in the drift layer 1 and base layer 2 and further extends even into the channel stopper layer 6 beyond some of the peripheral trenches 14. In such a manner, the plural peripheral trenches 14 reduce the curvature of the end of the depletion layer 8B extending within the drift layer 1, thus reducing the electric field concentration. This allows the IGBT 100 according to the first embodiment to have higher breakdown voltage.

In order to completely remove the curved portion at the diffusion layer end of the base layer 2, preferably, the width of some of the peripheral trenches 14 is larger than the width of the gate trenches 11 or some of the other peripheral trenches 14. The base layer 2 therefore has a depth substantially constant in the width direction of the semiconductor basic substance 10, thus preventing the capacitance coupling the adjacent peripheral trenches 14 from being uneven.

As shown in FIG. 2, each depletion layer 8A extending in the surface side of the semiconductor basic substance 10 mainly extends within the base layer 2. At this time, the edge portion of the depletion layer 8A extends from the interface between the drift layer 1 and base layer 2 to the vicinity of the outer wall of the cell region side of each peripheral trench 14 within the base layer 2. The end of the depletion layer 8A is exposed in the surface of the semiconductor basic substance 10. The depletion layer 8A extends along the outer wall of the cell region side of the peripheral trench 14, the bottom thereof, and the outer wall of the channel stopper layer 6 side thereof within the semiconductor base 10 and extends near the interface between the drift layer 1 and base layer 2 within the base layer 2. As shown in FIG. 2, the end of the depletion layer 8A extending along the outer wall of the cell region of the outermost peripheral trench 14 extends from the inside of the channel stopper layer 6 toward the inside of the semiconductor basic substance 10. As described above, in the IGBT 100 according to the first embodiment, the region where the ends of the depletion layers 8A extending in the surface side of the semiconductor basic substance 10 are exposed in the semiconductor basic substance 10 is smaller than that of the conventional semiconductor device. It is therefore possible to provide a semiconductor device which is less affected by changes in breakdown voltage due to movable ions or the like and provides high reliability. Moreover, the peripheral trenches 14 can be formed by using the same manufacturing processes as those of the gate trenches 11, and the number of manufacturing processes to form the peripheral trenches 14 can be substantially reduced. The IGBT 100 can be manufactured at lower cost than the conventional semiconductor device.

Moreover, the horizontal extension of the base layer 2 is configured to be terminated at the region of the peripheral trench 14 located outermost, and the base layer 2 and the channel stopper layer 6 are adjacent to each other only within the semiconductor basic substance 10. This can prevent the end of the depletion layer 8B from being exposed in the surface of the semiconductor basic substance 10. Furthermore, the channel stopper layer 6 blocks the horizontal extension of the depletion layer 8B to prevent the end of the depletion layer 8B from being exposed in the side surface of the semiconductor basic substance 10. It is therefore possible to provide a semiconductor device which is less affected by movable ions or the like and has high reliability.

Moreover, the channel stopper layer 6 has an impurity concentration enough lower than that of the base layer 2 and can therefore prevent that the base layer 2 is locally shallow in a manufacturing process of the IGBT 100. In other words, the capacitances coupling the adjacent peripheral trenches 14 are prevented from being uneven, thus preventing that high voltage is locally applied. It is therefore possible to improve the reliability of the semiconductor device according to the first embodiment. Furthermore, the chip size of the semiconductor device can be made smaller than that in the case where the base layer 2 is formed away from the channel stopper layer 6.

[First Modification]

Figure 3:
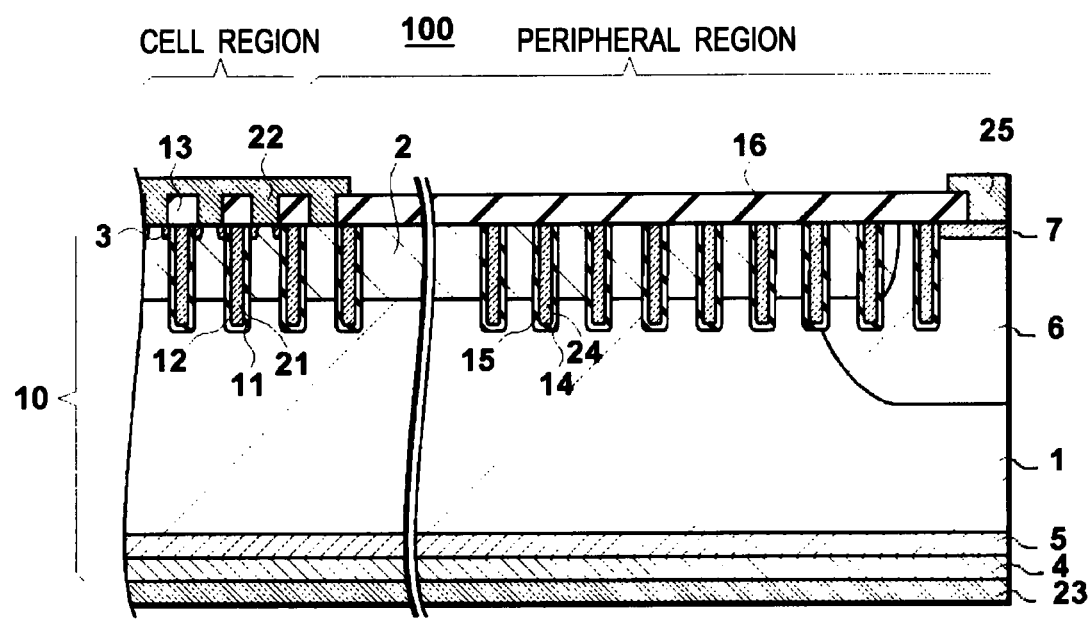
FIG. 3 is a view showing a cross-sectional structure of a semiconductor device according to a first modification of the first embodiment.

As shown in FIG. 3, in a semiconductor device according to the first modification of the first embodiment, the horizontal extension of the base layer 2 does not reach the peripheral trench 14 located outermost and extends to the cell region side (to the inner side) of the peripheral trench 14 located outermost. Furthermore, the horizontal extension of the base layer 2 extends to a range not reaching the channel stopper layer 7 within the channel stopper layer 6.

Figure 4:
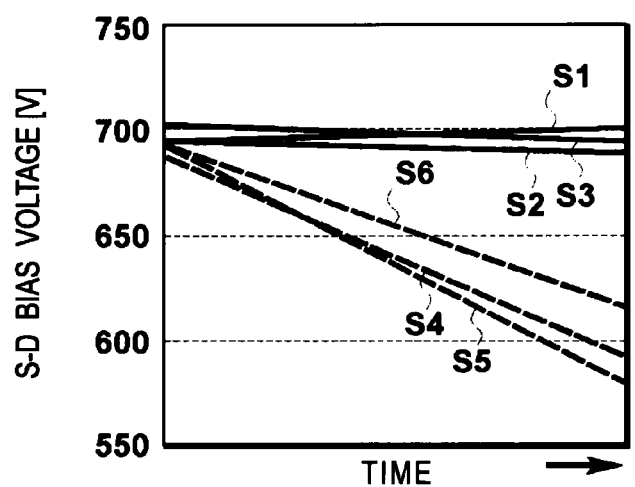
FIG. 4 is a chart showing breakdown voltage test results of the semiconductor device according to the first embodiment at high temperature and high humidity condition.

FIG. 4 is a chart showing breakdown voltage test results in a high temperature and high humidity condition. In FIG. 4, the vertical axis indicates drain-source bias voltage [V], and the horizontal axis indicates time [min]. Samples S1, S2, and S3 show the breakdown voltage test results of the semiconductor devices according to the first modification in which the horizontal extension of the base layer 2 is extended to the outside of the peripheral trench 14 located outermost. Samples S4, S5, and S6 show the breakdown voltage test results of semiconductor devices in which the horizontal extension of the base layer 2 is further extended to the outside of the region of the peripheral trench 14 located outermost.

As apparent from FIG. 4, according to the semiconductor device of the first modification, it is possible to provide a semiconductor device having high reliability without degradation of breakdown voltage with time.

[Second Modification]

Figure 5:
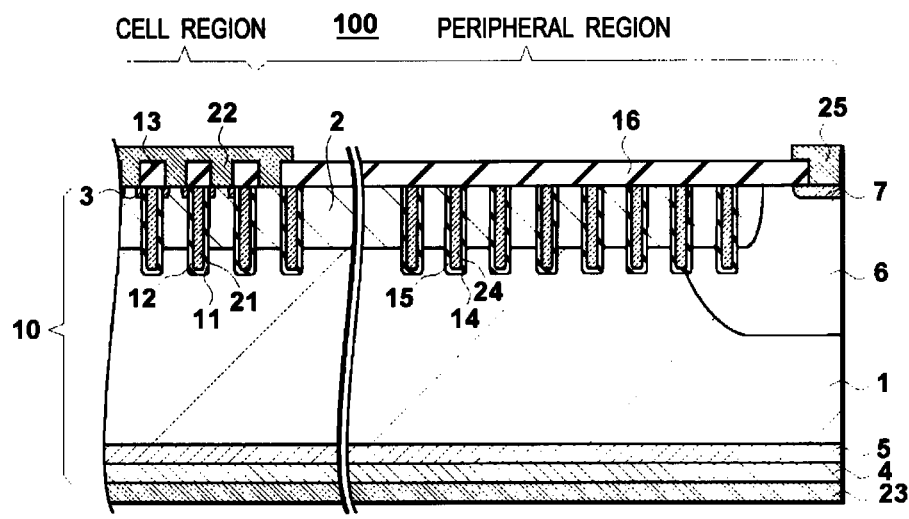
FIG. 5 is a view showing a cross-sectional structure of a semiconductor device according to a second modification of the first embodiment.

As shown in FIG. 5, in a semiconductor device according to the second modification of the first embodiment, the horizontal extension of the base layer 2 is not terminated in the region of the peripheral trench 14 located outermost and is extended to the outside of the peripheral trench 14 located outermost. Furthermore, in the second modification, the horizontal extension of the base layer 2 is extended in a range not reaching the channel stopper layer 7 within the channel stopper layer 6.

The semiconductor device according to the second modification, like the aforementioned breakdown test results of the samples S4, S5, and S6 shown in FIG. 4, degrades in breakdown voltage with time. However, since the end of the depletion layer 8B is not exposed in the surface of the semiconductor basic substance 10, the semiconductor device is less affected by the movable ions and the like and has high reliability.

[Third Modification]

Figure 6:
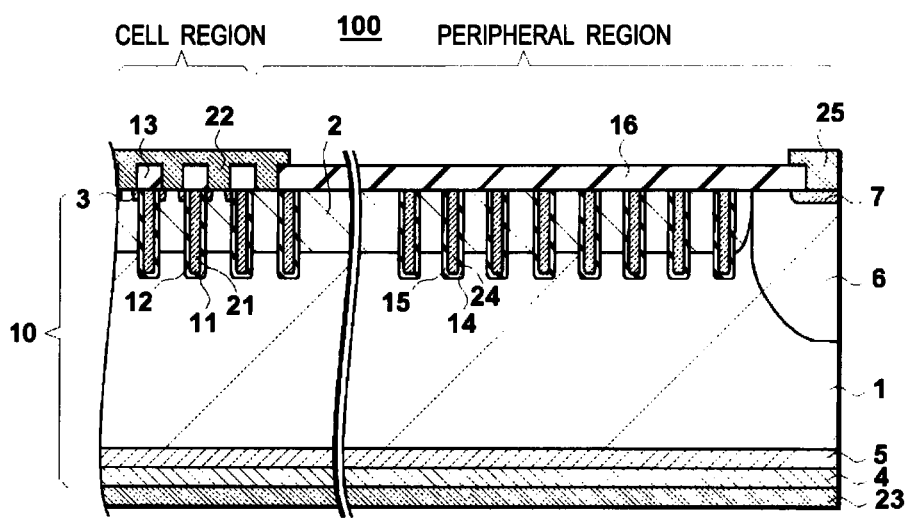
FIG. 6 is a view showing a cross-sectional structure of a semiconductor device according to a third modification of the first embodiment.

As shown in FIG. 6, in a semiconductor device according to the third modification of the first embodiment, similar to the semiconductor device according to the second modification, the horizontal extension of the base layer 2 is not terminated in the region of the peripheral trench 14 located outermost and is further extended to the outside of the peripheral trench 14 located outermost. In the semiconductor device according to the third modification, furthermore, the end of the base layer 2 in the horizontal direction and the end of the channel stopper layer 6 are adjacent to each other and are in contact to each other to form a p-n junction.

In the semiconductor device according to the third modification, similarly to the semiconductor device according to the first embodiment, the end of the depletion layer 8B is not exposed in the surface of the semiconductor basic substance 10. Accordingly, the semiconductor device is less affected by movable ions or the like and has high reliability.

Second Embodiment

In the second embodiment of the present invention, a description is given of an example of the semiconductor device according to the first embodiment described above in which the EQR electrode 25 in the peripheral region has a different shape.

Figure 7:
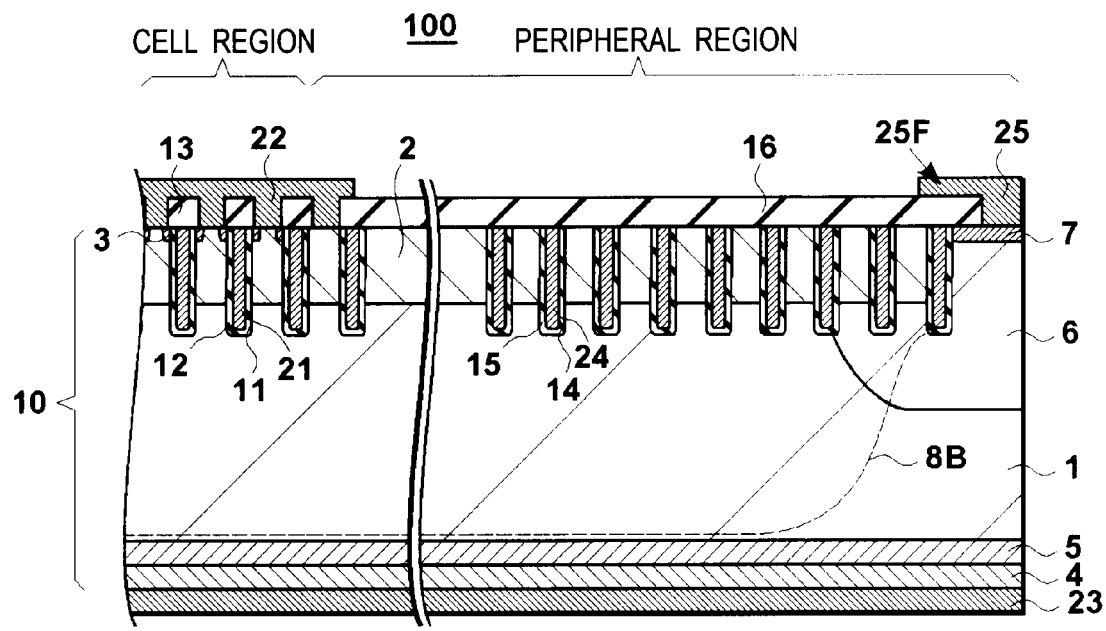
FIG. 7 is a view showing a cross-sectional structure of a semiconductor device according to a second embodiment of the present invention.

As shown in FIG. 7, in the semiconductor device according to the second embodiment, the EQR electrode 25 electrically connected to the channel stopper regions 6 and 7 which are layers terminating the peripheral region includes a first flange 25F laid above the peripheral trench 14 located outermost so as to overlap the outermost peripheral trench 14. The first flange 25F is a portion protruding from the EQR electrode 25 toward the cell region side (inward). The first flange 25F is composed of a same layer and a same conducting material as those of the EQR electrode 25 and is integrally formed with the EQR electrode 25. The first flange 25F is provided on the peripheral trench 14 with the insulating film 16 interposed therebetween.

In the semiconductor device according to the second embodiment, the first flange F laid over the peripheral trench 14 can improve the capacitive coupling of the conducting layer 24 in the peripheral trench 14 located outermost and the EQR electrode 25.

The first flange 25F is formed above the peripheral trench 14 located outermost so as to overlap the same but may be further extended to the cell region side in the region over the channel stopper region 6. The first flange 25F may be further extended to the cell region side beyond the region of the channel stopper region 6 in the peripheral region.

[Modification]

Figure 8:
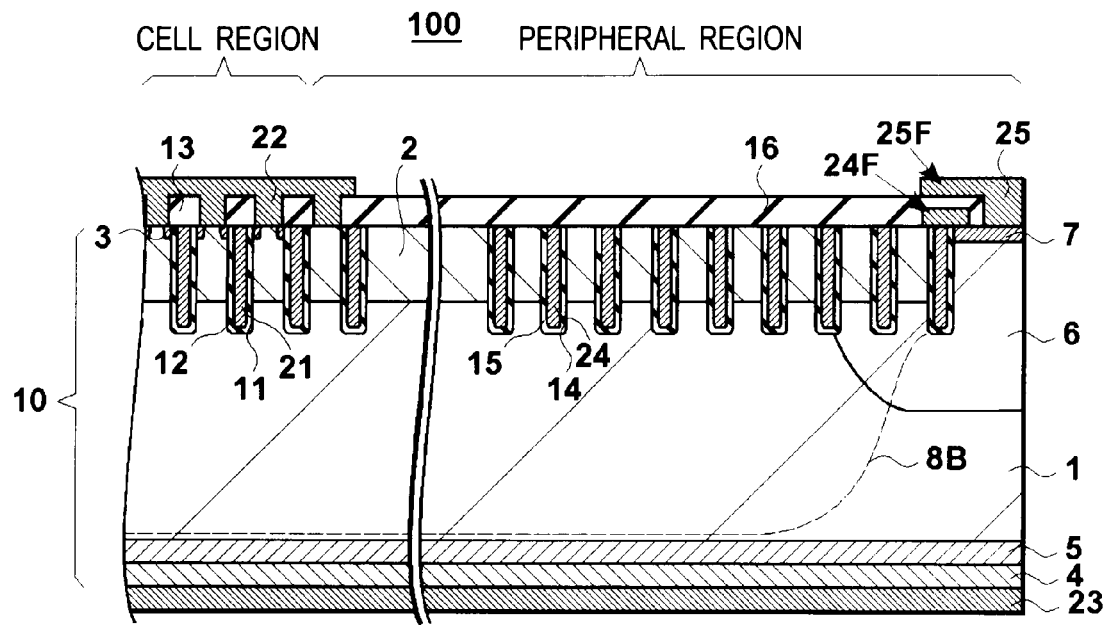
FIG. 8 is a view showing a cross-sectional structure of a semiconductor device according a modification of the second embodiment.
Figure 9:
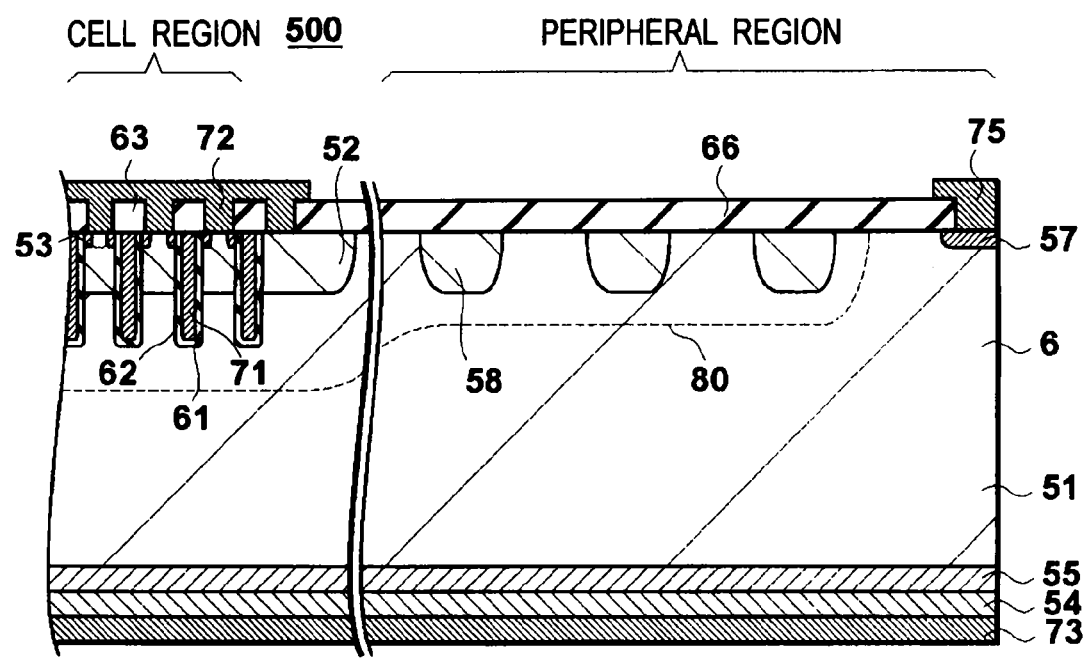
FIG. 9 is a view showing a cross-sectional structure of a conventional semiconductor device.

As shown in FIG. 8, a semiconductor device according to the modification of the second embodiment further includes a second flange 24F which is connected to the conducting layer 24 filled in the peripheral trench 14 located outermost in the peripheral region of the semiconductor device according to the second embodiment and is located so as to protrude on the semiconductor basic substance 10 and overlap the first flange 25F of the EQR electrode 25.

In the semiconductor device according to the modification, the second flange 24F is configured to overlap the first flange 25F to further improve the capacitive coupling of the conducting layer 24 within the peripheral trench 14 located outermost and the EQR electrode 25.

Hereinabove, the embodiments of the present invention are described, but the invention is not limited by the aforementioned embodiments. Various changes can be made for the invention within the scope of the present invention described in claims. For example, in the present invention, the p and n conductivity types may be interchanged in the aforementioned embodiments. The peripheral trenches 14 may be deeper than the channel stopper layer 6. Moreover, the present invention is applicable to insulated gate semiconductor devices including trenches such as MOSFETs.

INDUSTRIAL APPLICABILITY

The present invention can be widely used in semiconductor devices which have higher breakdown voltage and provide high reliability.

REFERENCE SIGNS LIST

1 DRIFT LAYER
2 BASE LAYER
3 EMITTER LAYER
4 COLLECTOR LAYER
5 BUFFER LAYER
6, 7 CHANNEL STOPPER LAYER
8A, 8B DEPLETION LAYER
12 GATE INSULATING FILM
13, 16 INTER-LAYER INSULATING FILM
14 PERIPHERAL TRENCH
15, 16 INSULTING FILM
21 GATE ELECTRODE
22 EMITTER ELECTRODE
23 COLLECTOR ELECTRODE
24 CONDUCTING LAYER
24F SECOND FLANGE
25 EQR ELECTRODE
25F FIRST FLANGE

The invention claimed is:
1. A semiconductor device, comprising:
a cell region including:
a first semiconductor layer having a first conductivity type;

a second semiconductor layer which is formed in an island shape in a surface of the first semiconductor layer and has a second conductivity type different from the first conductivity type;

a third semiconductor layer which is formed in an island shape in a surface of the second semiconductor layer and has the first conductivity type; and a plurality of gate trenches penetrating the second and third semiconductor layers and reaching an inside of the first semiconductor layer; and a peripheral region around the cell region, including:

a plurality of peripheral trenches penetrating the second and third semiconductor layers layer and reaching the inside of the first semiconductor layer; and a termination layer which is formed in an island shape in a surface of an outermost region of the first semiconductor layer away from the cell region and has the first conductivity type, wherein the first, second, and third semiconductor layers and the termination layer constitute a semiconductor basic substance having a surface in which the first semiconductor layer is not exposed in the surface side of the first semiconductor layer, and an impurity concentration of the termination layer is set from 0.2 to 1.0% of an impurity concentration of the second semiconductor layer, to calibrate capacitances coupling the adjacent peripheral trenches.

2. The semiconductor device according to claim 1, wherein the termination layer is adjacent to the second semiconductor layer and a diffusion layer end of the second semiconductor layer is adjacent to the peripheral trenches.

3. The semiconductor device according to claim 2, further comprising an equipotential ring electrode which is connected to the terminal layer and has a first flange located above the peripheral trench located outermost to overlap the peripheral trench located outermost.

4. The semiconductor device according to claim 1, wherein the termination layer is adjacent to the second semiconductor layer and a diffusion layer end of the second semiconductor layer is located to the cell region side of the peripheral trench located outermost.

5. The semiconductor device according to claim 4, further comprising an equipotential ring electrode which is connected to the terminal layer and has a first flange located above the peripheral trench located outermost to overlap the peripheral trench located outermost.

6. The semiconductor device according to claim 1, further comprising an equipotential ring electrode which is connected to the terminal layer and has a first flange located above the peripheral trench located outermost to overlap the peripheral trench located outermost.

7. The semiconductor device according to claim 6, further comprising a second flange which is connected to a conducting layer filled in the peripheral trench located outermost and is provided to protrude on the semiconductor basic substance around the peripheral trench located outermost and overlap the first flange of the equipotential ring electrode.

* * * * *